United States Patent [19]

Allen

[11] 4,408,134

[45] Oct. 4, 1983

[54] UNITARY EXCLUSIVE OR-AND LOGIC CIRCUIT

[75] Inventor: Michael Allen, San Francisco, Calif.

[73] Assignee: Advanced Micro Devices, Inc., Sunnyvale, Calif.

[21] Appl. No.: 226,323

[22] Filed: Jan. 19, 1981

[51] Int. Cl.³ .................. H03K 19/086; H03K 19/20; H03K 19/21
[52] U.S. Cl. .................................. 307/471; 307/455; 307/467
[58] Field of Search ............... 307/445, 446, 455, 467, 307/471, 472; 364/784, 769, 768

[56] References Cited

U.S. PATENT DOCUMENTS

| | | | |
|---|---|---|---|
| 3,515,904 | 6/1970 | Stopper | 307/455 X |
| 3,519,810 | 2/1970 | Ury Priel et al. | 364/784 |
| 3,649,844 | 3/1972 | Kroos | 307/471 |
| 3,906,212 | 9/1975 | Poguntke | 364/784 |
| 4,167,727 | 9/1979 | Anderson et al. | 307/467 X |

Primary Examiner—Larry N. Anagnos
Assistant Examiner—David R. Bertelson
Attorney, Agent, or Firm—Gary T. Aka; Patrick T. King

[57] ABSTRACT

A unitary logic circuit for performing the function of an EXCLUSIVE OR logic gate, the output terminal of which forms a first input terminal to an AND logic gate. Implemented in emitter-coupled logic technology, the circuit has a fast response time with low power consumption.

19 Claims, 5 Drawing Figures

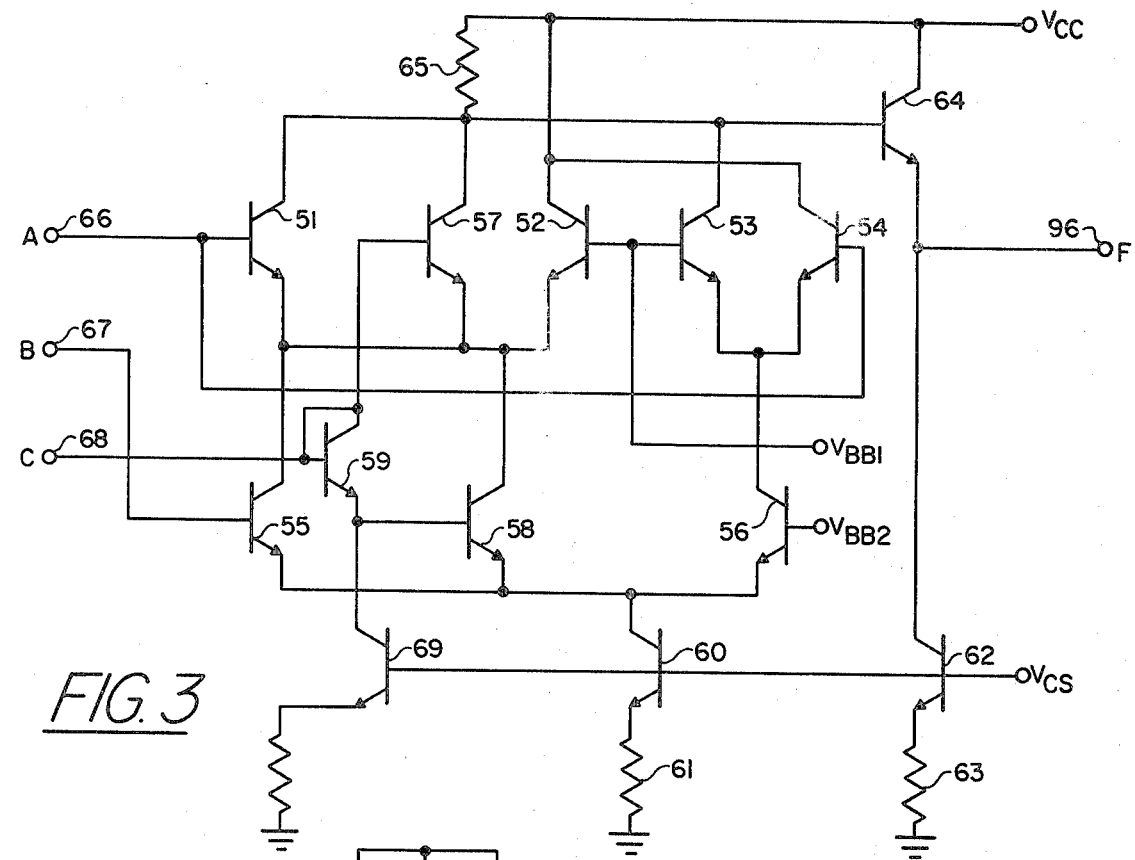

UNITARY EXCLUSIVE OR-AND LOGIC CIRCUIT

BACKGROUND OF THE INVENTION

1. Field of the Invention

This invention relates to electrical logic circuits and, more particularly, to emitter coupled logic (ECL) circuits for performing an EXCLUSIVE OR-AND logic function.

2. Prior Art

In the electrical arts logic circuits are classified into the functions they perform, such as the basic AND circuit and the OR circuit. Another way of classifying logic circuits is the particular technology by which the circuits are implemented. One such technology noted for its speed of response is emitter coupled logic (ECL).

In the design of larger and more complex circuits performing logic functions certain combinations of basic circuits recur. One such combination is the EXCLUSIVE OR (XOR) logic circuit having its output terminal as one input terminal to an AND circuit. This permits the output signal of the XOR circuit to pass through the AND circuit at the proper signal on the other input terminal of the AND circuit. One purpose for this combination is that the AND circuit serves as a logic gate by which the output signal of the XOR circuit may be multiplexed in combination with other circuit outputs onto a common signal line.

The prior art approach to implement this circuit is simply to connect an XOR gate to an AND gate. Such a combination of circuits has a certain response time determined by the gate delay of, first, the XOR gate and then the AND gate. Power consumption, an important consideration for ECL, is set by the power requirements of two gates. Finally, from the standpoint of using the XOR-AND combination as part of an integrated circuit device, the two logic gate circuits occupy a certain amount of valuable space on the substrate of the integrated circuit device.

SUMMARY OF THE INVENTION

The present invention provides a novel unitary XOR-AND logic circuit in ECL technology, which can replace the combination of logic gate circuits of the prior art.

The novel circuit has a faster response time. Power consumption is lowered and the amount of space occupied by the circuit is decreased.

The present invention is a circuit having circuit branches for providing a variety of paths for current generated by a current source. Each circuit branch has a transistor responsive to signals for controlling the current flow through the circuit branch. The circuit branches are interconnected with a resistance element in such a manner that the current flow through the element is controlled by the particular path selected for current flow by the combination of input signals. The voltage generated across the resistance element is the output of the circuit.

One embodiment of the circuit has first, second and third pairs of first and second circuit branches, each pair coupled at one end and having the first circuit branch with a first opposite end and the second circuit branch with a second opposite end. The coupled end of the first pair of circuit branches is connected to a current source, the coupled end of the second pair connected to the first opposite end of the first pair and the coupled end of the third pair connected to the second opposite end of said first pair. A voltage source is connected to the first and second opposite ends of the second pair with a resistance element interposed between the voltage source and the first opposite end. The first and second opposite ends of the third pair are respectively connected to the first and second opposite ends of the second pair. A third circuit branch is connected in parallel with the first circuit branch of the second pair and a fourth circuit branch is connected in parallel with the first circuit branch of the first pair.

The transistors associated with these circuit branches are connected such that the transistors of the first circuit branch of the second pair and the second circuit branch of the third pair are responsive to a first input signal, the transistors of the second circuit branch of the second pair and the first circuit branch of the third pair are responsive to a first reference signal. The transistor of the first circuit branch of the first pair is responsive to a second input signal and the transistor of the second circuit branch of the first pair responsive to a second reference signal so that only one of each pair of circuit branches is capable of conducting current.

Furthermore, there is provided a means responsive to a third input signal for applying input signals to the transistors of the third and fourth circuit branches so that these circuit branches are capable of conducting current.

The output of the circuit is characterized by current flow through the resistance element, or the lack of current flow, controlled by the combination of first, second and third input signals selecting the circuit branches for current flow therethrough. Functionally, the first and second input signals are the input signals to the XOR logic gate, the output signal of the XOR gate forming a first input signal to the AND logic gate, while the third input signal is the complementary or inverted signal on a second input terminal of the AND logic gate.

Another embodiment of the unitary XOR-AND logic gate circuit has first, second and third pairs of first and second circuit branches, each pair coupled at one end, the first circuit branch having a first opposite end and a second circuit branch having a second opposite end. The coupled end of the first pair of circuit branches is connected to a first current source. The coupled end of the second pair of circuit branches is connected to the first opposite end of the first pair and the coupled end of the third pair of circuit branches connected to the second opposite end of the first pair. To a voltage source the first and second opposite ends of the second pair are connected with the first opposite end connected to the voltage source through a first resistance element. The first and second opposite ends of the third pair are respectively connected to the first and second opposite ends of the second pair and a third circuit branch is connected in parallel with the first circuit branch of the second pair.

Each circuit branch has a transistor responsive to signals for controlling current through the respective circuit branch.

The circuit further includes a combinatorial means for generating a signal responsive to second and third input signals. The transistors of the first circuit branch of the second pair and the second circuit branch of the third pair are responsive to a first input signal, while the transistors of the second circuit branch of the second pair and the first circuit branch of the third pair are responsive to a first reference signal. In the first pair, the transistor of the first circuit branch is responsive to the combinatorial means and the transistor of the second circuit branch is responsive to a second reference signal. The transistor of the third circuit branch also is responsive to the third input signal.

As described previously, the output of the circuit is characterized by the current flow, or the lack of current flow, through the resistance element. The first, second and third input signals with respect to the first and second reference signals select the current path through the circuit branches, which determines whether current flows through the resistance element or not.

Functionally this circuit operates as the embodiment discussed above with the first and second input signals forming input signals to the XOR logic gate, the output of which is the first input to the AND logic gate. The third input signal is the complementary signal provided on a second input terminal of the AND gate.

Each circuit branch of the present invention comprises the collector and emitter of the transistor associated with the circuit branch and the transistor in response to signals upon its base controls the current through its emitter and collector and, thus, the current through the circuit branch. Additionally, when implemented in ECL technology, each pair of circuit branches has the emitters of the corresponding emitters connected at the coupled end of the pair.

In this way the functions of the XOR and AND logic circuits are combined into a unitary circuit having the advantages of faster response time, lower power consumption and smaller space occupation over the prior art.

BRIEF DESCRIPTION OF THE DRAWINGS

FIG. 3 is a schematic of one embodiment of the present invention, the unitary XOR-AND logic circuit.

FIG. 4 is a schematic of another embodiment of the unitary XOR-AND logic circuit.

FIG. 5 illustrates the unitary XOR-AND circuit in terms of logic gates.

DETAILED DESCRIPTION

Figure 1:
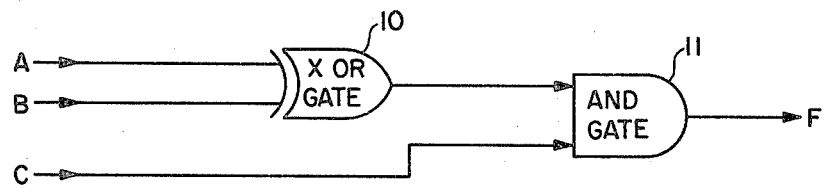
FIG. 1 is an illustration of the relationship of the XOR and AND logic gate related to the present invention.

FIG. 1 of the drawings symbolically represents the function of an XOR gate 10 having two input signals, A and B, having its output terminal tied to one input terminal of an AND gate 11. The other input terminal of the AND gate 11 is free to accept input signals C. When the signal C is a logical "1", the AND gate 11 will pass on the output signal from the XOR gate 10. The signal provided on the output terminal of the AND gate 11, F, will be whatever the output signal of the logic gate 10 is, whether "0" or "1". When the signal C is "0", the XOR gate is cut off and the output signal F is always "0". Thus the AND gate 11 can be used as a multiplexer for the operation of the XOR gate 10.

Figure 2:
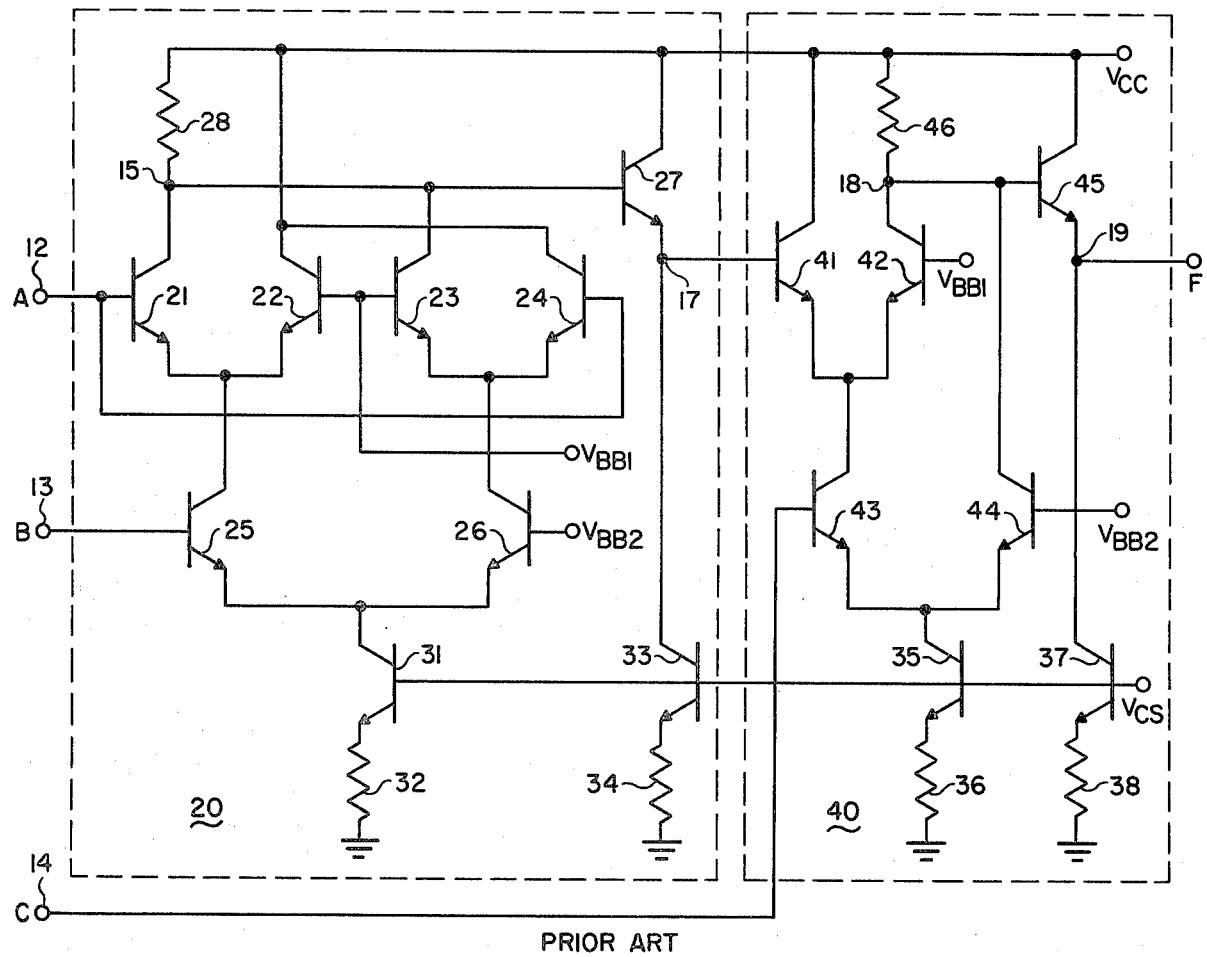
FIG. 2 shows a straightforward, prior art circuit schematic of the XOR-AND logic circuit.

FIG. 2 is a schematic of the implementation of the logic gates shown in FIG. 1. In a straightforward manner the XOR gate indicated by the block 20 enclosed by a dotted line is simply connected to the AND gate 40 also enclosed by a dotted line. The XOR circuit has a first pair of circuit branches, each branch comprising the emitter and collector of the transistors 25 and 26 respectively. The base of the transistor 25 is connected to an input terminal 13 which receives an input signal B, while the base of the transistor 26 is held at a one reference voltage $V_{BB2}$ by a reference voltage source. The emitters of the transistors 25 and 26 are coupled together and connected to a current source, which is shown here as a resistor 32 and a transistor 31 having its base held at a current supply reference voltage $V_{CS}$. The opposite ends of the first pair, essentially the collectors of the transistors 25 and 26, are connected to second and third pairs of circuit branches.

The second pair of circuit branches comprising the emitters and collectors of the transistors 21 and 22, are coupled at one end by the connecting emitters of the transistors 21 and 22. Similarly the third pair with the transistors 23 and 24 are also coupled at one end. The coupled emitters of the transistors 21 and 22 are connected to the collector of the transistor 25 and the coupled emitters of the transistors 23 and 24 to the collector of the transistor 26. The bases of the transistors 21 and 24 are connected to a second input terminal 12 which receives an input signal A, while the bases of the transistors 22 and 23 are held to another reference voltage $V_{BB1}$ by another reference voltage source.

To a voltage supply source at voltage $V_{CC}$ the collectors of the transistors 22 and 24 are connected. The collectors of the transistors 21 and 23 are also connected to the voltage supply source by a common node 15 and through a resistance element 28.

In operation $V_{CC}$ is set at plus 5 volts, $V_{BB1}$ is set at 3.9 volts and $V_{BB2}$ is set at 3.15 volts. The input signals A and B operate in two different voltage ranges, A between 3.55 volts to 4.25 volts and B between 2.8 volts to 3.5 volts. An input signal in the upper portions of the ranges of either A or B is a logical "1" and a signal in the lower portions of the ranges is a logical "0". Of course, it is understood that the present invention is not limited to these particular voltages.

The ECL XOR circuit 20 operates by directing current into different branches of the circuit depending upon the input signals A and B.

Input signals of "1" switch on the transistor receiving the signal through its base electrode. For example, the voltage range for the input signal B is chosen with respect to the reference voltage $V_{BB2}$ such that a "1" for signal B is a higher voltage than $V_{BB2}$. With the base electrode of the transistor 25 at a higher voltage than the base electrode of the transistor 26, the transistor 25 has a full forward biased diode drop (approximately 0.75 volts) across the base-emitter junction of the transistor 25. Since the emitters of the transistors 25 and 26 are coupled together, both emitters are at the same voltage, a diode drop below the "1" voltage for signal B. This implies that the base-emitter voltage drop for the transistor 26 is less than a full diode drop since $V_{BB2}$ is less than the base electrode voltage of the transistor 25. Thus a current flows through the emitters, and, by transistor action, the collector of the transistor 25. Little current, except for some slight leakage current, passes through the transistor 26. The transistor 25 is "on" and transistor 26 is "off," which results in current flow through the circuit branch controlled by the transistor 25 rather than through the other circuit branch controlled by the transistor 26.

Should there be a "0" signal on the base of the transistor 25, then the roles of the two transistors and corresponding circuit branches are reversed. The transistor 26 has a full diode drop across its base-emitter junction, while the transistor 25 does not. The transistor 26 is turned on and current passes through its circuit branch. The transistor 25 is off with little or no current through its corresponding circuit branch.

Similarly, the input signal A operates in a voltage range with respect to the reference voltage $V_{BB1}$ so as to shunt currents through the circuit branches controlled by the transistors receiving the input signal A or the reference voltage $V_{BB1}$. If signal B is "1" and current is flowing through the circuit branch of the transistor 25, then one of the pair of circuit branches controlled by the transistors 21 and 22 will also have current flow depending upon whether signal A is "1" or "0". Likewise, if signal B is "0" and current is flowing through the circuit branch controlled by the transistor 26, then one of the pair of circuit branches controlled by the transistors 23 and 24 will have current flow depending upon the input signal A.

The circuit 20 is an XOR circuit because if both A and B are "1" or "0", the current flows through circuit branches of the transistors 25 and 21 or the circuit branches of the transistors 26 and 23 and through a resistance element 28 which lowers the output voltage at the node 15 for an output signal of "0". A "1" for either input signal A or B, but not both, will send the current through either the circuit branches of the transistor 26 and 24 or the circuit branches of the transistor 25 and 22 respectively. In this case the current does not pass through the resistance element 28. The output node 15 goes high, i.e., "1". The XOR logic function is achieved.

The current in the circuit 20 is generated by the current source formed by a transistor 31 and a resistor 32. The amount of current from the current source, i.e., the amount of current flowing through the collector of the transistor 31, is equal to the current through the emitter of the transistor 31 for all practical purposes. This, in turn, is simply the current through the resistor 32. This current is determined by the voltage across the resistor 32 ($V_{CS}$ minus a diode drop, the base-emitter junction voltage drop of the transistor 31) divided by the resistance of the element 32. In this manner, $V_{CS}$ and the resistor 32 determine the strength of the current.

Alternatively, a large value resistor can be used in place of the transistor 31 and the resistor 32. Though the voltage across the resistor (the voltage difference between the coupled emitters of the transistors 25 and 26 and ground) can vary to some extent depending upon the input signals A and B, the large value of the resistance reduces the significance of these voltage variations so that, for all practical purposes, a constant current flows through the resistor. This version of a current source, however, has the disadvantage that too large a resistor cuts down the amount of current needed for optimum response times for the circuit.

Also included as part of the XOR circuit 20 is a buffer transistor 27, which has its base connected to the node 15 and its emitter connected to a current source, the transistor 33 and resistor 34. The transistor 27, being in an emitter follower node, has its output node 17 follow the voltage of the node 15. An output signal at the node 15 is tracked by the node 17, i.e., a "1" at the node 15 is a "1" at the node 17, though the actual voltage at the node 17 is a diode drop lower. This arrangement permits the output node 15 to drive the circuits receiving signals from the XOR circuit.

The AND circuit 40 receives the output of the XOR circuit through the base electrode of a transistor 41 which has its emitter coupled to a transistor 42 having its base electrode tied to the first reference voltage $V_{BB1}$. The collector electrode of the transistor 42 is connected to the voltage supply through an impedance element 46. The coupled emitters of the transistors 41 and 42 are connected to the collecter electrode of a transistor 43 which has its emitter coupled to that of a transistor 44. The base electrode of the transister 44 is tied to the second reference voltage $V_{BB2}$ and the collector electrode of the transistor 44 is connected to the collector of transistor 42. To the coupled emitters of the transistors 43 and 44 is connected a current source, a transistor 35 and a resistance element 36. The second input terminal 14 to the AND gate 40, receiving the input signal C, is connected to the base electrode of the transistor 43.

When C is "1", then current passes through the circuit branch formed by the emitter-collector of the transistor 43 and flows through either the circuit branches of the transistor 41 or the transistor 42 depending upon the state of the output node 17. The output signal from the XOR circuit 20 appears as the output for the AND circuit 40. If the output node 17 is high or "1", then the transistor 41 is turned on and the transistor 42 off. This means that the output node 18 will become high and the output node 19 will also follow through the buffer transistor 45. If C is "0", then the current from the current source will flow through the circuit branch of the transistor 44 from the voltage supply through the resistance element 46. No matter what the output at node 17 is, the output of the AND circuit 40, F, is "0". The output signal from the XOR circuit 20 is cut off.

Performing the same functions as the circuits of FIG. 2 is the present invention, a novel circuit in which the XOR and AND functions are combined into a single unitary circuit.

FIG. 3 shows one embodiment of the novel circuit. The circuit has a first pair of circuit branches formed by the transistors 55 and 56, a second pair formed by the transistors 51 and 52 and a third pair by the transistors 53 and 54. As discussed previously, an XOR function is performed by the selection of circuit branches for current flow by the particular combination of input signals to the transistors forming part of, and controlling current through, their respective circuit branches. A transistor 60 and resistor 61 form a current source for the circuit. There is also provided a buffer transistor 64 with another current source, the transistor 62 and resistor 63. Also included in the circuit is a circuit branch connected in parallel to the circuit branch controlled by the transistor 51 receiving the input signal A. A transistor 57 controlling the parallel circuit branch thus has its emitter and collector connected to the emitter and collector of the transistor 51 respectively. Another circuit branch represented by the emitter-collector of a transistor 58 is connected in parallel with the branch circuit of transistor 55 receiving the input signal B. The base of the transistor 57 receives the input signal C. The same is true with the transistor 58 except that the signal voltage is displaced by a diode 59 shown here as a transistor with base and collector connected in a short circuit to operate as a diode. Connected also to the diode 59 is a current source with a transistor 69 and a resistor to properly bias the diode 59 for a full diode voltage displacement.

In one particular implementation of this circuit the values of all resistance of the current sources are 1.4 kiloohms with $V_{CS}$ at 1.45 volts. To obtain the desired output voltages the resistance element 28 is 1.5 kiloohms. Of course, these values may be varied to satisfy different requirements, such faster response time at the expense of more power dissipation and the like.

This circuit operates with the same operating voltages and voltage ranges as the circuit in FIG. 2. The input signals A and C operate in the higher voltage range and the input signal B operates in the lower. When the input signal C is "0", the transistors 57 and 58 turn off and are disabled, and their circuit branches are open. The rest of the circuit then appears to be similar to the XOR circuit 20 of FIG. 2. The input signals A and B are "XORed" with the result appearing at an output terminal 96. However, when C is "1", the transistors 57 and 58 are turned on and their corresponding circuit branches become part of a connecting path from the voltage supply at $V_{CC}$, through the resistance element 65, to the current source connected to ground. Since current flows through the resistance element 65, the voltage to the base of the transistor 64 is low and the output signal F of the circuit is "0". This output occurs regardless of the input signal A and B. The XOR function of the circuit is disabled.

Thus the circuit in FIG. 3 operates with the same result as the XOR-AND circuit shown in FIG. 2. One slight difference is that the complement of the third input signal C is used to allow the XOR function signals to pass to the output. A "0" signal allows signals to pass through, rather than a "1" signal used in the prior art circuit configuration of FIG. 2. Comparison of the circuits in FIGS. 2 and 3 indicate that the number of current sources in FIG. 3 is less than the number appearing in FIG. 2, which shows that less power is required to operate the FIG. 3 circuit. Moreover, it is clear that the number of components in the FIG. 3 circuit is less than that for FIG. 2. Having a smaller number of components, the circuit can be implemented in a smaller area of intergrated circuit semiconductor chip. Finally the novel circuit in FIG. 3 is capable of operating at a higher speed than the prior art circuit. Computer simulation of the operational characteristics of the two circuits using identical parameters and identical operating currents indicates that the unitary circuit of FIG. 3 is at least twice as fast as the prior art circuit.

A second embodiment of the present invention is shown in FIG. 4. The circuit has a first pair of circuit branches formed by the transistors 74 and 75, a second pair formed by the transistors 70 and 71 and a third pair by the transistors 72 and 73 interconnected in the same fashion as discussed above. However, parallel to the circuit branch formed by the transistor 70 is another circuit branch formed by a transistor 76 responsive to an input signal $C_1$. The input to the transistor 74 is provided by two parallel circuit branches formed by the transistors 77 and 80, connected between the voltage supply at $V_{CC}$ and a current source. The two transistors 80 and 77 respectively receive the input signals B and $C_1$ for a combinatorial signal to the base of the transistor 74. Operating as an OR logic gate, the parallel circuit branches pass on a "1" signal to the base of the transistor 74 to switch it on whenever the input signal B or input signal $C_1$ is "1". This is true when both are "1" also.

This circuit operates as discussed previously. In response to the input signals a logical output is generated by the shunting of current through selected circuit branches resulting in a current flow, or the lack of it, through a resistance element 88 for an output signal F through the buffer transistor 86.

In this circuit there is also provided a resistance element 89 to generate in the same manner a complementary output signal $\overline{F}$. When $C_1$ is "1", a current path is provided through the circuit branches of the transistor 76 and 74. The output signal F is low or "0"; $\overline{F}$ is high or "1". When $C_1$ is "0" then this current path is removed and the normal XOR function of input signals A and B can occur.

This manner of generating a complementary output signal $\overline{F}$ by placing a resistive element 89 between the second opposite end of the second pair of circuit branches as illustrated in FIG. 4 can also be used in the circuit of FIG. 3. Of course, if only the complementary signal $\overline{F}$ is desired, then the resistive elements in these circuits required to generate the output signal F may be eliminated. With the complementary signal $\overline{F}$ the XOR logic gate portion a becomes COINCIDENCE logic gate circuit so that a "1" output signal results if and only if both input signals A and B are the same or conicide.

Additional circuit branches may be added to provide for additional input signals governing the functional AND logic gate portion of the circuit. FIG. 4 shows a circuit branch controlled by a transistor 78 added in parallel to the circuit branch of transistor 76 and another circuit branch of a transistor 79 parallel to that of the transistor 77. Both transistors 78 and 79 of the additional circuit branches are responsive to an input signal $C_N$ representing the Nth input to the logic gate AND. Operation of the additional circuit branches in response to the input signal $C_N$ is the same as that for the circuit branches responsive to $C_1$. Any one or more "1" signals for the input signals $C_1$ through $C_N$ make the output on the output terminal 94 "0" and the output on the complementary output terminal 95 "1". If all of the signals $C_1$ through $C_N$ are "0", the result of the XOR function of A and B appears on the terminal 94, and the complement on the terminal 95.

One further difference between this embodiment of the invention and that shown in FIG. 3 is that all the input signals operate in one voltage range. Since the B signal at the input terminal 91 passes through the base-emitter junction of the transistor 75, both A and B signals are in the same range. The signals $C_1$ through $C_N$ signals are in same range by similar reasoning.

FIG. 5 illustrates the circuit of FIG. 4 in logic gate form. FIG. 5 also illustrates the circuit in FIG. 3 if the AND gate 11 receives only the input signal $C_1$.

It should be noted that while the present invention has been explained in terms of an EXCLUSIVE OR logic gate, the circuit is equivalently a COINCIDENCE circuit if negative logic, i.e., a "high" or "1" signal is considered "0" and a "low" or "0" signal is considered "1", is used.

Accordingly, while the invention has been particularly shown and described with reference to the preferred embodiments, it will be understood by those skilled in the art that changes in form and details may be made therein without departing from the spirit of the invention. This is therefore intended that an exclusive right be granted to the invention as limited only by the metes and bounds of the appended claims.

What is claimed is:
1. A circuit comprising
first and second transistors having emitters coupled together, collectors of said first and second transistors connected to a first voltage source with a first impedance means between the collector of said first transistor and said first voltage source, a base of said first transistor connected to a first input terminal, a base of said second transistor connected to a first reference voltage source, third and fourth transistors having emitters coupled together, a collector of said third transistor connected to the collector of said first transistor, a collector of said fourth transistor connected to the collector of said second transistor, a base of said third transistor connected to said first reference voltage source, a base of said fourth transistor connected to said first input terminal, fifth and sixth transistors having emitters coupled together, a collector of said fifth transistor connected to the coupled emitters of said first and second transistors, a collector of said sixth transistor connected to the coupled emitters of said third and fourth transistors, a base of said fifth transistor connected to a second input terminal, a base of said sixth transistor connected to a second reference voltage source, a first current source connected to the coupled emitters of said fifth and sixth transistors, a seventh transistor having an emitter connected to the coupled emitters of said first and second transistors, a collector connected to the collector of said first transistor, a base connected to a third input terminal, an eighth transistor having an emitter connected to the coupled emitters of said fifth and sixth transistors, a collector connected to the coupled emitters of said first and second transistors, a base connected to said third input terminal through a voltage displacement means, and a second current source connected to the base of said eighth transistor, whereby functionally said first and second input terminals form the input terminals of an EXCLUSIVE OR logic gate, the output terminal of said EXCLUSIVE OR logic gate forms a first input terminal to an AND logic gate, and said third input terminal forms a second input of said AND logic gate.

2. The circuit as in claim 1 further comprising second impedance means connected between the collector of said second transistor and said first voltage source whereby an output terminal connected between the collector of said second transistor and said second impedance means provides the complementary output of said circuit.

3. The circuit as in claim 1 wherein said voltage displacement means comprises a diode.

4. The circuit as in claim 1 further comprising a transistor in an emitter follower configuration, connected to the collector of said first transistor to buffer the output signal thereat.

5. A circuit comprising
first and second transistor having emitters coupled together, collectors of said first and second transistors connected to a first voltage source with a first impedance means between the collector of said first transistor and said first voltage source, a base of said first transistor connected to a first input terminal, and a base of said second transistor connected to a first reference voltage source, third and fourth transistors having emitters coupled together, a collector of said third transistor connected to the collector of said first transistor, a collector of said fourth transistor connected to the collector of said second transistor, a base of said third transistor connected to said first reference voltage source, a base of said fourth transistor connected to said first input terminal, fifth and sixth transistors having emitters coupled together, a collector of said fifth transistor connected to the coupled emitters of said first and second transistors, a collector of said sixth transistor connected to the coupled emitters of said third and fourth transistors, a base of said sixth transistor connected to a second reference voltage source, a first current source connected to the coupled emitters of said fifth and sixth transistors, a seventh transistor having an emitter connected to the base of said fifth transistor, a collector connected to said first voltage source, and a base connected to a second input terminal, an eighth transistor having an emitter connected to the coupled emitters of said first and second transistors, a collector connected to the collector of said first transistor, and a base connected to a third input terminal, a ninth transistor having an emitter connected to the base of said fifth transistor, a collector connected to said first voltage source, and a base connected to said third input terminal, a second current source connected to the base of said fifth transistor, whereby functionally said first and second input terminals form the input terminals of an EXCLUSIVE OR logic-gate, the output terminal of said EXCLUSIVE OR logic gate forms a first input terminal to an AND logic gate, and said third input terminal forms a second input terminal of said AND logic gate.

6. The circuit as in claim 5 further comprising a second impedance means connected between the collector of said second transistor and said first voltage source whereby an output terminal connected between the collector of said second transistor and said second impedance means provides the complementary output of said circuit.

7. The circuit as in claim 5 further comprising a transistor in an emitter follower configuration, connected to the collector of said first transistor to buffer the output signal thereat.

8. An EXCLUSIVE-OR-AND logic gate circuit comprising:
first, second and third pairs of first and second switching elements, each switching element respectively having a first and second terminal at the ends thereof, said first pair of switching elements having its first terminals coupled together and connected to a first current source, said second pair of switching elements having its first terminals coupled together and connected to the second terminal of the first switching element of said first pair, and having its second terminals connected to a voltage source with said first terminal of the first switching element connected through a first resistive means to said voltage source, said third pair of switching elements having its first terminals coupled together and connected to the second terminal of the second switching element of the first pair of switching elements, the third pair of switching elements having the second terminal of the first switching element connected to the second terminal of the first switching element of said second pair of switching elements and having the second terminal of the second switching element connected to the second terminal of the second switching element of the second pair, a third switching element having first and second terminals and connected in parallel with said first sweitching element of said second pair of switching elements, a fourth switching element having first and second terminals and connected in parallel with said first switching element of said first pair, each switching element having a third terminal responsive to signals for controlling the current flow through said switching element, the third terminals of said first switching element of said second pair and said second switching element of said third pair are responsive to a first input signal, the third terminals of said second switching element of said second pair and said first switching element of said third pair are responsive to a first reference signal, the third terminal of said first switching element of said first pair is responsive to a second input signal and the third terminal of said second switching element of said first pair is responsive to a second reference signal so that only one of each pair of switching elements is capable of conducting current, means responsive to a third input signal for applying input signals to the third terminals of the third and fourth switching elements so that said third and fourth switching elements are capable of conducting current, whereby the output of said logic gate circuit is manifested by current flow through said first resistive means, which current flow is controlled by the combination of said first, second and third input signals with respect to said first and second reference signals selecting switching elements for current flow therethrough.

9. A circuit as in claim 8 further comprising a second resistive means connected between said second terminal of the second switching element of said second pair of switching elements and said voltage source for providing a complementary output of said circuit.

10. A circuit as in claim 8 wherein each switching element comprises a transistor having a collector, emitter, and base associated therewith, said transistor controlling current flow through said collector and emitter by being responsive to signals on the base of said transistor.

11. A circuit as in claim 10 further comprising an output buffer transistor connected in an emitter follower mode responsive to the output of said circuit.

12. An EXCLUSIVE OR-AND logic gate circuit comprising:

first, second and third pairs of first and second switching elements, each switching element, respectively having a first and a second terminal at the ends thereof, said first pair of switching elements having their first terminals coupled and connected to a first current source, said second pair of switching elements having its first terminals thereof coupled and connected to the second terminal of the first switching element of said first pair, and having its second terminals connected to a voltage source with the second terminal of the first switching element connected through a first resistive means to said voltage source, said third pair of switching elements having its first terminals coupled together and connected to the second terminal of the second switching element of the first pair, and having its second terminal of the first switching element connected to the second terminal of the first switching element of said second pair and having the second terminal of the second switching element connected to the second terminal of the second switching element of said second pair, a third switching element having first and second terminals and connected in parallel to said first switching element of said second pair, each switching element having a third terminal responsive to signals for controlling current flow through said switching element, the third terminals of said first switching element of said second pair and said second switching element of said third pair being responsive to a first input signal, the third terminals of said second switching element of said second pair and said first switching element of said third pair being responsive to a first reference signal, combinatorial means for generating an output signal responsive to second and third input signals, the third terminal of said first switching element of said first pair being responsive to said combinatorial means ouput signal, the third terminal of said second switching element of said first pair being responsive to a second reference signal and the third terminal of said third switching element being responsive to said third input signal, whereby the output of said logic gate circuit is manifested by current flow through said resistive means, which current flow is controlled by the combination of first, second and third input signals with respect to said first and second reference signals selecting said switching elements for current flow therethrough.

13. A circuit as in claim 12 further comprising a second resistive means connected between the second terminal of the second switching element of said second pair of switching elements and said voltage source for providing a complementary output of said circuit.

14. A circuit as in claim 12 wherein each switching element comprises a transistor having a collector, emitter, and base associated therewith, said transistor controlling current flow through said collector and emitter by being responsive to signals on the base of said transistor.

15. A circuit as in claim 13 wherein said combinatorial means further comprises fourth and fifth switching elements, each having first, second, and third terminals, said third terminal being responsive to said second and third input signals, respectively, for controlling current flow through said first and second terminals of said fourth and fifth switching elements the fourth and fifth switching elements having their first terminals coupled together and connected to a second current source, the third of said first switching element of said first pair receiving signals from the coupled first terminals of the fourth and fifth switching elements, said second terminals of said fourth and fifth switching elements being connected to said voltage source.

16. A circuit as in claim 15 further comprising at least two additional switching elements, each having first, second, and the third terminals, said third terminals controlling current flow through said first and second terminals of said first and second additional switching elements, said first additional switching element connected in parallel to said third switching element and said second additional switching element connected in parallel to said fifth switching element, said third terminals of said first and second additional switching elements being responsive to an additional input signal.

17. A circuit as in claim 14 further comprising an output buffer transistor connected in an emitter follower mode responsive to the output of said circuit.

18. A COINCIDENCE-AND logic gate circuit comprising:

first, second and third pairs of first and second switching elements, respectively having a first and a second terminal at the ends thereof, said first pair of switching elements having their first terminals coupled together and connected to a first current source, said second pair of switching elements having its first terminals coupled together and connected to the second terminal of the first switching element of said first pair, and having its second terminals connected to a voltage source with the second terminal of the first switching element connected through a resistive means to said voltage source, said third pair of switching elements having its first terminals coupled together and connected to the second terminal of the second switching element of the first pair, having its second terminal of the first switching element connected to the second terminal of the first switching element of said second pair, and having the second terminal of the second switching element connected to the second terminal of the second switching element of said second pair, a third switching element having first and second terminals and connected in parallel with said first switching element of said second pair, a fourth switching element having first and second terminals and connected in parallel with said first switching element of said first pair, each switching element having a third terminal responsive to signals for controlling the current flow through said switching element, the third terminals of said first switching element of said second pair and said second switching element of said third pair are responsive to a first input signal, the third terminals of said second switching element of said second pair and said first switching element of said third pair are responsive to a first reference signal, the third terminal of said first switching element of said first pair is responsive to a second input signal and the third terminal of said second switching element of said first pair is responsive to a second reference signal so that only one of each pair of switching elements is capable of conducting current, means responsive to a third input signal for applying input signals to the third terminals of said third and fourth switching elements so that said third and fourth switching elements are capable of conducting current, whereby the output of said logic gate circuit is manifested by current flow through said resistive means, which current flow is controlled by the combination of said first, second and third input signals with respect to said first and second reference signals selecting switching elements for current flow therethrough.

19. A COINCIDENCE-AND logic gate circuit comprising:

first, second and third pairs of first and second switching elements each respectively having a first and a second terminal at the ends thereof, said first pair of switching elements having their first terminals coupled and connected to a first current source, said second pair of switching elements having its first terminals coupled together and connected to the second terminal of the first switching element of said first pair, and having its second terminals connected to a voltage source with the second terminal of the first switching element connected through a resistive means to said voltage source, said third pair of switching elements having its first terminals coupled together and connected to the second terminal of the second switching element of the said first pair, and having the second terminal of the first switching element connected to the second terminal of the first switching element of said second pair and the second terminal of the second switching element connected to the second terminal of the second switching element of said second pair, a thrid switching element having a first and second terminal and connected in parallel with said first switching element of said second pair, each switching element having a third terminal responsive to signals for controlling the current flow through said switching element, the third terminals of said first switching element of said second pair and said second switching element of said third pair are responsive to a first input signal, the third terminals of said second switching element of said second pair and said first switching element of said third pair are responsive to a first reference signal, combinatorial means for generating and output signal responsive to second and third input signals, the third terminal of said first switching element of said first pair is responsive to said combinatorial means output signal, the third terminal of said second switching element of said first pair is responsive to a second reference signal and the third terminal of said third switching element is responsive to said third input signal, whereby the output of said logic gate circuit is manifested by current flow through said resistive means, which flow is controlled by the combination of first, second and third input signals with respect to said first and second reference signals selecting said switching elements for current flow therethrough.

* * * * *